United States Patent
Prather et al.

(10) Patent No.: US 11,342,039 B2
(45) Date of Patent: May 24, 2022

(54) WORD LINE CHARACTERISTICS MONITORS FOR MEMORY DEVICES AND ASSOCIATED METHODS AND SYSTEMS

(71) Applicant: Micron Technology, Inc., Boise, ID (US)

(72) Inventors: Matthew A. Prather, Boise, ID (US); Randall J. Rooney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 17/081,731

(22) Filed: Oct. 27, 2020

(65) Prior Publication Data

US 2022/0130484 A1    Apr. 28, 2022

(51) Int. Cl.

| | |
|---|---|
| *G11C 29/42* | (2006.01) |
| *G11C 29/44* | (2006.01) |
| *G11C 11/4074* | (2006.01) |
| *G11C 11/408* | (2006.01) |
| *G11C 11/406* | (2006.01) |
| *G11C 29/00* | (2006.01) |

(52) U.S. Cl.
CPC .......... *G11C 29/42* (2013.01); *G11C 11/4074* (2013.01); *G11C 11/4085* (2013.01); *G11C 11/40615* (2013.01); *G11C 29/44* (2013.01); *G11C 29/76* (2013.01)

(58) Field of Classification Search
CPC ...................................................... G11C 29/42
USPC ...................................................... 365/185.09
See application file for complete search history.

(56) References Cited

U.S. PATENT DOCUMENTS

| | | | | |
|---|---|---|---|---|
| 5,901,096 | A * | 5/1999 | Inokuchi | G11C 29/025 365/201 |
| 9,672,875 | B2 * | 6/2017 | Park | G11C 16/10 |
| 2004/0246761 | A1 * | 12/2004 | Nishihara | G11C 11/22 365/145 |

* cited by examiner

*Primary Examiner* — Muna A Techane
(74) *Attorney, Agent, or Firm* — Perkins Coie LLP (57) ABSTRACT

Memory devices, systems including memory devices, and methods of operating memory devices are described, in which memory devices are configured to monitor word line characteristics. In one embodiment, the memory device includes a memory array including a word line (e.g., a local word line) and a word line driver coupled thereto. When the memory device activates the word line driver, the memory device may generate a diagnostic signal in response to the word line voltage reaching a threshold. Further, the memory device may generate a reference signal to compare the diagnostic signal with the reference signal. In some cases, the memory device may generate an alert signal based on comparing the diagnostic signal with the reference signal if the diagnostic signal indicates a symptom of degradation in the word line characteristics. The memory device may implement certain preventive and/or precautionary measures upon detecting the symptom.

20 Claims, 6 Drawing Sheets

WORD LINE CHARACTERISTICS MONITORS FOR MEMORY DEVICES AND ASSOCIATED METHODS AND SYSTEMS

TECHNICAL FIELD

The present disclosure generally relates to semiconductor memory devices, and more particularly relates to word line characteristics monitors for memory devices and associated methods and systems.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and nonvolatile memory. Volatile memory, including random-access memory (RAM), static random-access memory (SRAM), dynamic random-access memory (DRAM), and synchronous dynamic random-access memory (SDRAM), among others, require a source of applied power to maintain its data. Nonvolatile memory, by contrast, can retain its stored data even when not externally powered. Nonvolatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure. The components in the drawings are not necessarily to scale. Instead, emphasis is placed on illustrating clearly the principles of the present technology.

DETAILED DESCRIPTION

As memory cells scale to increase memory densities and storage capacities of memory devices, meeting various reliability criteria for the memory devices becomes ever more challenging. Error checking and correcting (ECC) functions may help to circumvent certain reliability issues, but add overheads in overall memory system bandwidths and costs. As such, memory systems may reduce ECC robustness, which in turn, tends to increase memory device failures in the field. Further, challenges associated with forming word lines of memory arrays in the state of the art semiconductor fabrication technology (e.g., DRAM technology) may generate unusual defect mechanism(s) that may be latent in nature. Such defect mechanism(s) may manifest as various reliability issues after the memory devices have been implemented in a system (e.g., compute systems, data center environments), which may cause the system shutdown, in some cases.

Individual word lines (rows) of memory arrays are coupled with a plurality of memory cells (e.g., 1,024 DRAM cells) through switching transistors (e.g., gates of metal-oxide-semiconductor (MOS) transistors). When a word line voltage is greater than threshold voltages of the switching transistors, the memory cells are connected ("open") to corresponding bit lines. Similarly, when the word line voltage is less than threshold voltages of the switching transistors, the memory cells are not connected ("closed") to the corresponding bit lines. As such, switching characteristics of word lines are important for the memory array. If the word line voltage turns on too slow, the memory cells may not be able to "share" their charge to the bit lines, and sense amplifiers coupled to the bit lines may not be able to determine logic states (e.g., 0 or 1) of the memory cells within a specified time frame. Similarly, if the word line voltage turns off too slow, the memory cells may not be closed fast enough from the bit lines, and the logic states of the memory cells may be corrupted. Such failures incurred by inadequate word line characteristics (e.g., switching characteristics) may be referred to as row failures. In some cases, row failures may not be correctable (e.g., beyond the ECC capability). Additionally, or alternatively, the row failures may be undetectable.

Several embodiments of the present technology are directed to monitoring switching characteristics of word lines of memory arrays. The present technology may be utilized to monitor and detect degradations (or symptoms of degradations) of word line switching characteristics such that the memory devices including the memory arrays may implement precautionary and/or preventive measures against row failures at an early stage to avoid problems during memory operations—e.g., massive sensing failures, corrupted data, or the like. Such monitoring of word line switching characteristics may be accomplished at the worst case location in view of signal propagation along the word lines as well as stringent processing conditions. The precautionary and/or preventive measures may include quarantining certain portions of the memory arrays, retiring memory device(s) if appropriate, notifying a host device coupled with the memory devices of the degradations (or symptoms of degradations), monitoring "weak" word lines for their behaviors since detecting the degradations or symptoms thereof, increasing ECC robustness, among others.

A memory device that supports embodiments of the present technology is described with reference to FIG. 1. More detailed descriptions of memory arrays and schemes for monitoring word line switching characteristics are provided with reference to FIG. 2. Timing diagrams are described in FIG. 3 to illustrate monitoring and detecting the word line switching characteristics in accordance with embodiments of the present technology. More detailed descriptions of monitoring word line switching characteristics for memory devices in accordance with embodiments of the present technology are provided with reference to FIG. 4. A memory system including a memory device configured to support word line characteristics monitors in accordance with embodiments of the present technology is described with reference to FIG. 5. A method of operating the memory device for word line characteristics monitors in accordance with embodiments of the present technology is described with reference to FIG. 6.

Figure 1:
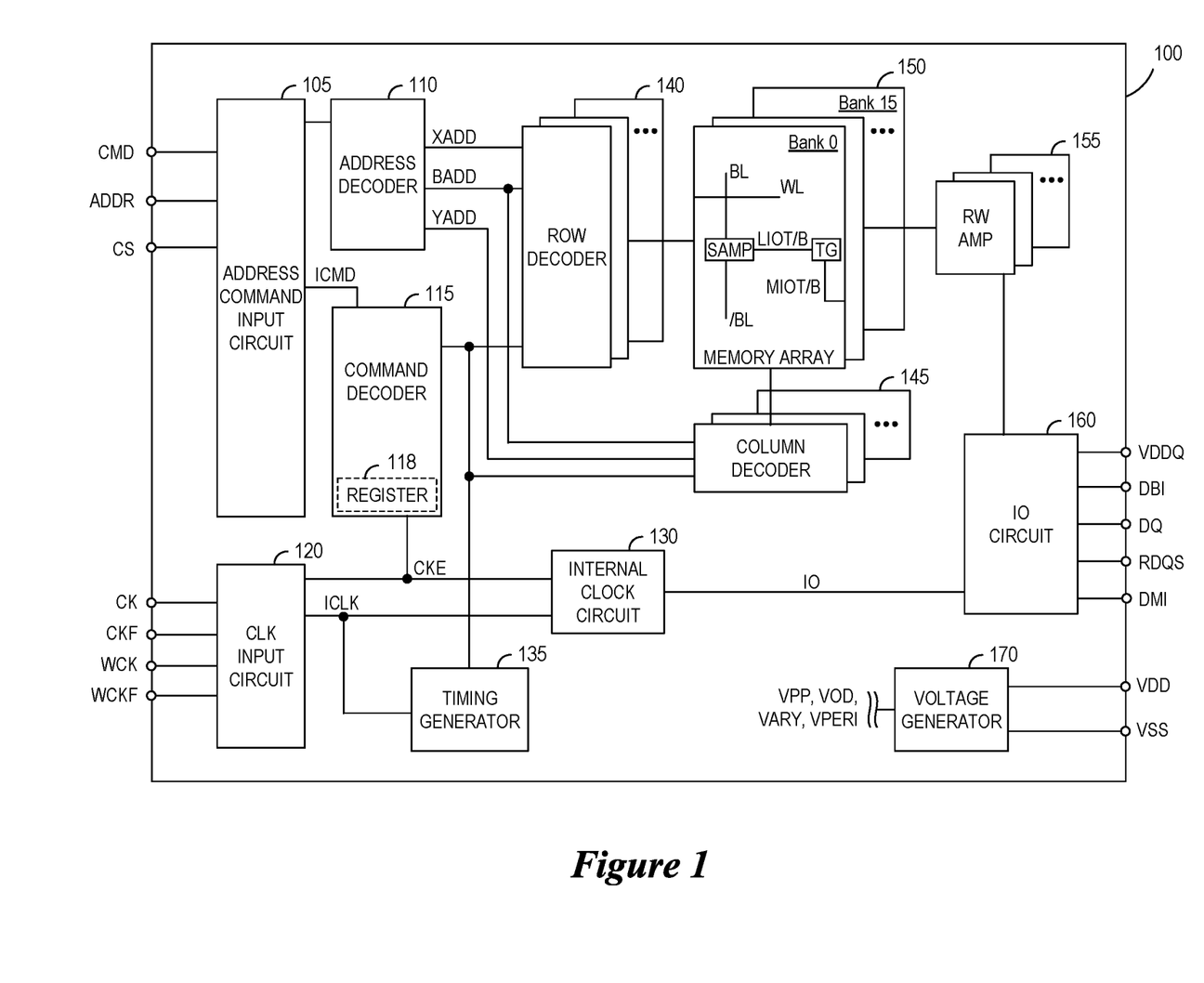
FIG. 1 is a block diagram schematically illustrating a memory device in accordance with embodiments of the present technology.

FIG. 1 is a block diagram schematically illustrating a memory device 100 in accordance with embodiments of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells (e.g., m×n memory cells) arranged at intersections of the word lines (e.g., m word lines, which may also be referred to as rows) and the bit lines (e.g., n bit lines, which may also be referred to as columns). Each word line of the plurality may be coupled with a corresponding word line driver (WL driver) configured to control a voltage of the word line during memory operations.

In some embodiments, each of the word lines in the memory array 150 is coupled to a word line voltage (WLV) monitoring component. In some embodiments, the WLV monitoring component may include a switch (e.g., an n-channel MOS transistor, a p-channel MOS transistor, a diode), which may turn on or off in response to the WLV reaching a threshold such that an electric current (i.e., a diagnostic signal) can flow. In some embodiments, the WLV monitoring component may include a circuit configured to switch on or off in response to the WLV reaching the threshold. The WLV monitoring component may generate (and/or transmit, otherwise give rise to) a diagnostic signal based on monitoring (and/or detecting) the WLV reaching the threshold. Further, the memory device 100 may be configured to generate a reference (or a reference signal) such that a comparator (not shown) of the memory device 100 can compare the diagnostic signal and the reference signal. The comparator may generate (and/or transmit) an alert signal for the memory device 100 if the diagnostic signal indicates signs of degradation in the word line switching characteristics in view of the reference signal. Subsequently, the memory device 100 may take certain precautionary and/or preventive measures, such as notifying a host device coupled with the memory device 100.

Memory cells can include any one of a number of different memory media types, including capacitive, phase change, magnetoresistive, ferroelectric, or the like. In some embodiments, a portion of the memory array 150 may be configured to store ECC parity bits. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140 (which may be referred to as a row driver), and a decoded column address signal (YADD) to the column decoder 145 (which may be referred to as a column driver). The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS, from a memory controller. The command signals may represent various memory commands from the memory controller (e.g., refresh commands, activate commands, precharge commands, access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105.

The command decoder 115 may include circuits to decode the internal command signals ICMD to generate various internal signals and commands for performing memory operations, for example, a row command signal to select a word line and a column command signal to select a bit line. Other examples of memory operations that the memory device 100 may perform based on decoding the internal command signals ICMD includes a refresh command (e.g., re-establishing full charges stored in individual memory cells of the memory array 150), an activate command (e.g., activating a row in a particular bank, in some cases for subsequent access operations), or a precharge command (e.g., deactivating the activated row in the particular bank). The internal command signals can also include output and input activation commands, such as clocked command CMDCK (not shown in FIG. 1).

The command decoder 115, in some embodiments, may further include one or more registers 118 for tracking various counts and/or values (e.g., counts of refresh commands received by the memory device 100 or self-refresh operations performed by the memory device 100) and/or for storing various operating conditions for the memory device 100 to perform certain functions, features, and modes (or test modes). As such, in some embodiments, the registers 118 (or a subset of the registers 118) may be referred to as mode registers. Additionally, or alternatively, the memory device 100 may include registers 118 as a separate component out of the command decoder 115. In some embodiments, the registers 118 may include multi-purpose registers (MPRs) configured to write and/or read specialized data to and/or from the memory device 100.

When a read command is issued to a bank with an open row and a column address is timely supplied as part of the read command, read data can be read from memory cells in the memory array 150 designated by the row address (which may have been provided as part of the activate command identifying the open row) and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (e.g., the register 118). The read latency information RL can be defined in terms of clock cycles of the CK clock signal. For example, the read latency information RL can be a number of clock cycles of the CK signal after the read command is received by the memory device 100 when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (e.g., register 118). The write latency WL information can be defined in terms of clock cycles of the CK clock signal. For example, the write latency WL information can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command decoder 115. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

Figure 2:
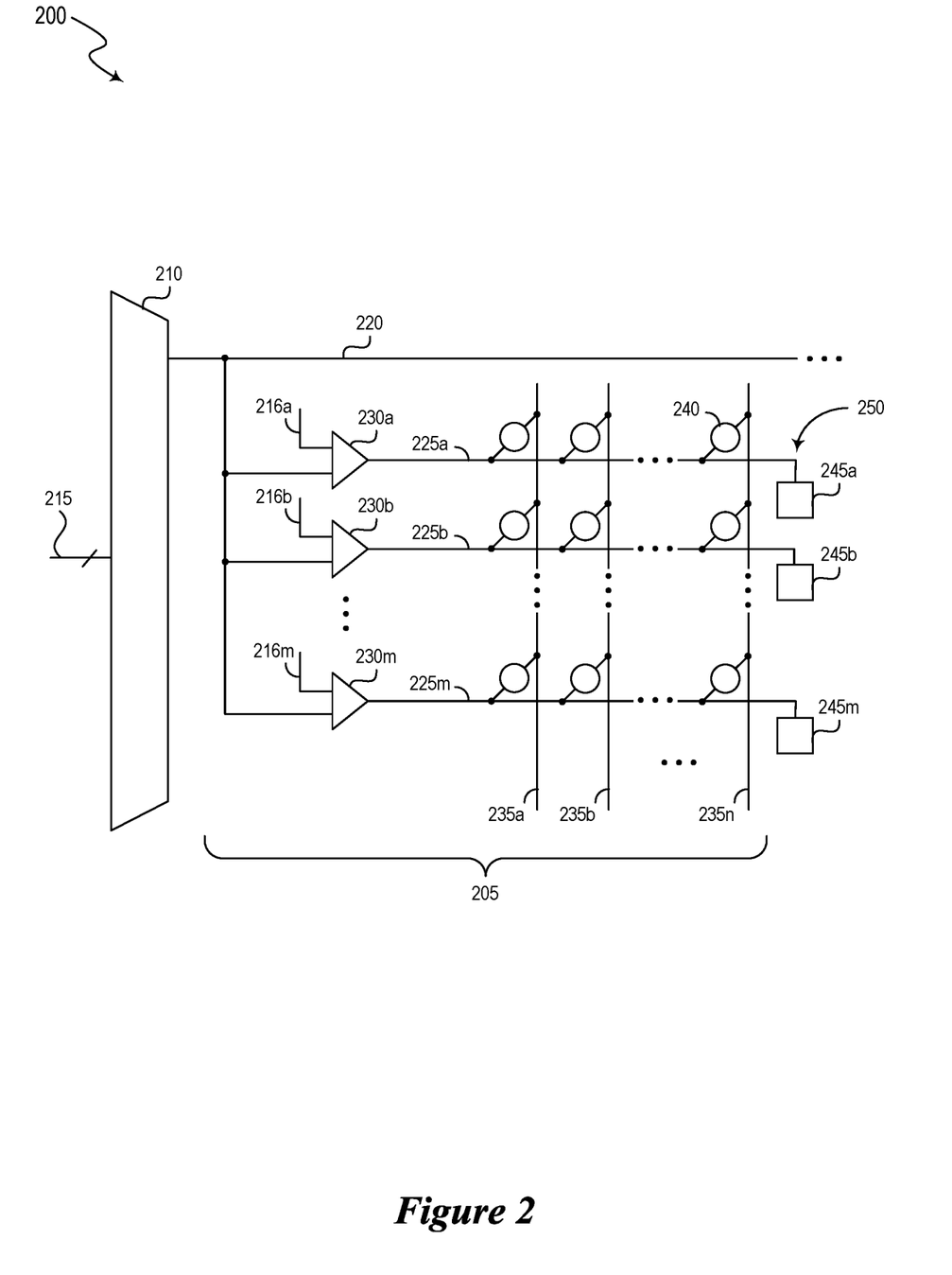
FIG. 2 is a block diagram illustrating word line characteristics monitors for a memory device in accordance with embodiments of the present technology.

FIG. 2 is a block diagram 200 illustrating word line characteristics monitors for a memory device (e.g., the memory device 100 described with reference to FIG. 1) in accordance with embodiments of the present technology.

The diagram 200 includes a memory array 205, which may be an example of or includes aspects of the memory array 150 described with reference to FIG. 1. Further, the diagram 200 includes a word line decoder 210 (which may be an example of or include aspects of the row decoder 140) and a plurality of WLV monitoring components 245 (also identified individually as WLV monitoring components 245a through 245m).

The memory array 205 may include a plurality of global word lines (one of which is shown as a global word line 220) and a plurality of local word lines 225 coupled with the global word line 220. The local word lines may be referred to as sub-word lines. Further, the memory array 205 includes a plurality of bit lines 235, as well as memory cells 240 at each topological intersections between the local word lines 225 and the bit lines 235. The memory array 205 also includes a plurality of word line drivers 230 (also identified individually as word line drivers 230a through 230m), each of which is coupled to corresponding local word line 225. The word line drivers 230 may be configured to receive input signals 216 (also identified individually as input signals 216a through 216m) configured to activate a particular word line driver to select (e.g., drive) one of the local word lines 225. In some embodiments, the word line decoder 210 may be configured to receive an address signal 215 (e.g., XADD described with reference to FIG. 1) and select the global word line 220. Further, the word line decoder 210 may also select (e.g., via the input signals 216) a particular word line driver 230 to activate (e.g., select, drive, turn on or off) one of the local word lines 225 based on the address signal 215.

The diagram 200 depicts individual WLV monitoring components 245 coupled to corresponding local word lines 225. Each WLV monitoring component 245 may be configured to monitor changes in voltages (e.g., WLVs) of the corresponding local word line 225. In some embodiments, the WLV monitoring component 245 may include a single n-channel MOS transistor or a single p-channel MOS transistor. For example, in response to a WLV increasing to reach a first threshold (e.g., in response to an Activate command executed to a local word line 225), the n-channel MOS transistor (or the p-channel MOS transistor) may turn on (or off) to indicate that the local word lines 225 reached the threshold. Similarly, in response to a WLV decreasing to reach another threshold (e.g., in response to a Precharge command executed to a local word line 225), the n-channel MOS transistor (or the p-channel MOS transistor) may turn off (or on) to indicate that the local word lines 225 reached the second threshold.

In some embodiments, the WLV monitoring components 245 may be disposed at opposite ends of the local word lines 225 (e.g., locations 250) from the word line drivers 230. In other words, the word line drivers 230 may be coupled to the local word lines 225 from first ends of the local word lines and the WLV monitoring components 245 may be coupled to the local word lines 225 from second ends of the local word lines, which are opposite to the first ends. Such locations of the local word lines 225 (e.g., the locations 250 corresponding to the opposite ends of a local word line 225 from the word line drivers 230) may be regarded as worst case locations for the local word lines establishing a requisite WLV in view of delays associated with a voltage signal propagating from one end of the local word line to the other end—e.g., due to a distributed RC-network associated with a local word line. Accordingly, the WLV monitoring components 245 attached at the opposite ends of the local word lines 225 (e.g., the worst case locations 250) may monitor worst case transitions in WLV from the viewpoint of the voltage signal propagation.

Further, in view of fabricating a high density memory arrays, forming the local word lines 225 may correspond to one of the most challenging areas during the manufacturing process steps for memory devices including the memory arrays 205. For example, widths of the local word lines 225 may correspond to the minimum line width of a given process technology node. Similarly, spaces between the local word lines 225 may correspond to the minimum space of the process technology node. As such, a portion of the memory array 205 including the local word lines 225 may be prone to include defect(s) that may lead to degradations in the word line switching characteristics and/or row failures. As such, the WLV monitoring components 245 coupled to the local word lines 225 can be regarded as providing sensitive diagnostic signals related to the word line switching characteristics from the viewpoint of the manufacturing process technology.

Although in the foregoing examples, each local word line 225 is described and illustrated to be coupled with a word line driver 230 at one end and a WLV monitoring component 245 at the opposite end, the present technology is not limited thereto. For example, more than one WLV monitoring components may be coupled to a local word line 225. Further, one or more WLV monitoring components may be coupled at various locations different from the opposite end. For example, peculiar interactions between the processing conditions and the layout of the memory array may determine the worst case locations at different locations of the local word line, other than the opposite end from the word line driver 230. Similarly, one or more WLV monitoring components may be coupled to various locations of the global word lines. Further, a voltage monitoring component similar to the WLV monitoring component may be coupled to various functional blocks of the memory device other than word lines (e.g., sensing components, row decoder, column decoder) to provide circuit health diagnostic signals.

Figure 3:
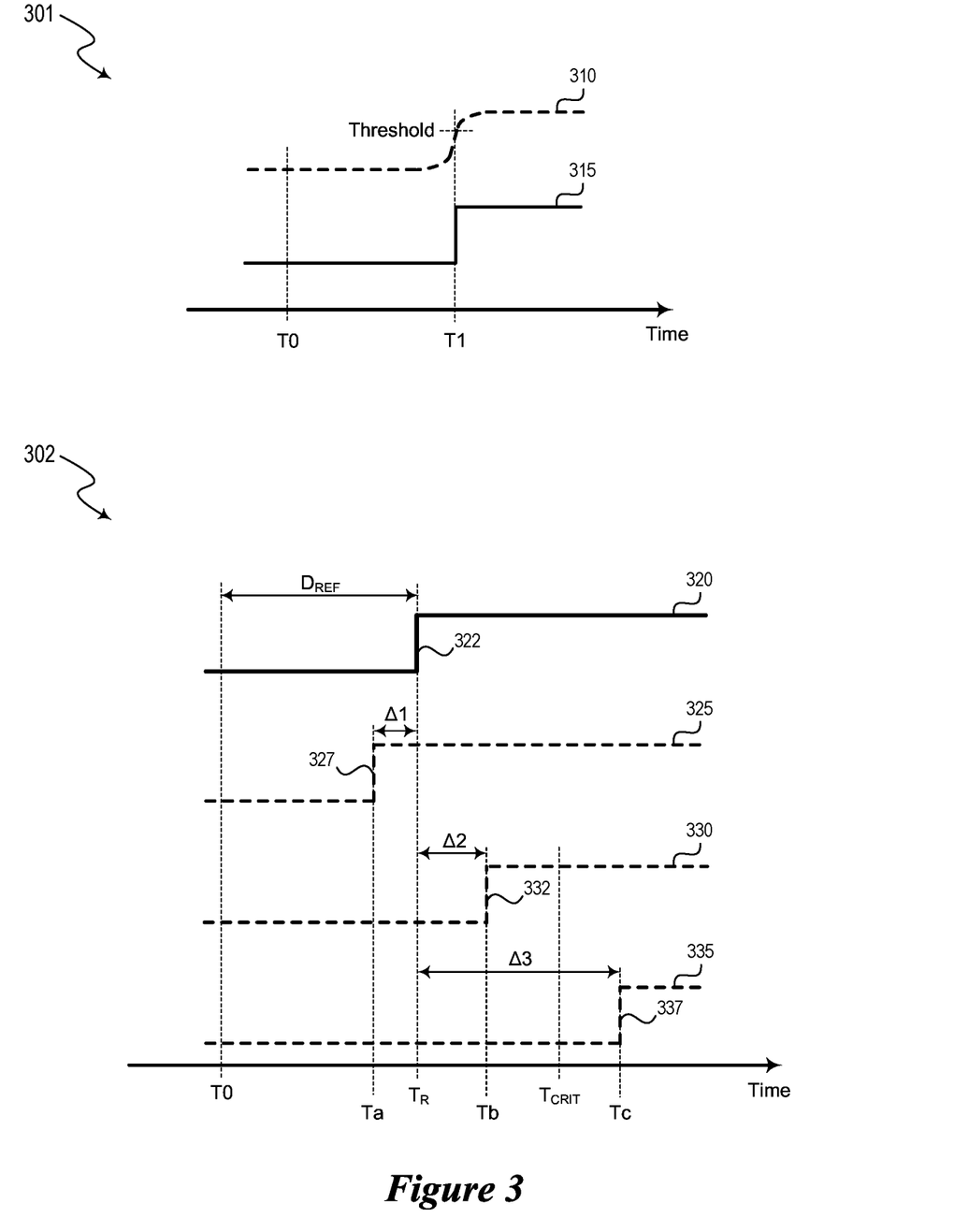
FIG. 3 illustrates timing diagrams associated with word line characteristics monitors for a memory device in accordance with embodiments of the present technology.

FIG. 3 illustrates timing diagrams 301 and 302 associated with a word line characteristics monitors for a memory device (e.g., the memory devices described with reference to FIGS. 1 and 2) in accordance with embodiments of the present technology. The timing diagram 301 includes an example word line voltage (WLV) waveform 310 and an example diagnostic signal (or waveform) that can be generated (transmitted) by a WLV monitoring component (e.g., the WLV monitoring components 245) based on the WLV waveform 310. The timing diagram 302 includes a reference signal 320, which may also be referred to a reference (or a reference waveform) that can be generated by the memory device. Further, the timing diagram 302 illustrates diagnostic signals (or waveforms) 325, 330, and 335 that can be generated by (transmitted by) the WLV monitoring components based on WLV waveforms of the word lines to which the WLV monitoring components are coupled.

The WLV waveform 310 of the diagram 301 illustrates an upward transition in voltage of a word line (e.g., the local word lines 225) in response to the memory device activating a word line driver coupled to the word line (e.g., the word line drivers 230) at time T0. The WLV waveform 310 may correspond to voltage of the word line at its worst case location (e.g., the worst case location 250). For example, the memory device may activate the word line driver 230a coupled to the local word line 225a at time T0 to execute an Activate command. Due to the propagate delay through the word line from the word line driver 230a to the worst case location 250, the WLV at the worst case location may start to rise after the time T0. At time T1, the WLV may reach a threshold that has been predetermined based on several factors—e.g., threshold voltages (VT) of the switching transistors of the memory cells, statistical process variations influencing the VT values, among others.

The WLV monitoring component 245a coupled to the local word line 225a may be configured to determine (e.g., detect, sense) that the word line voltage reaches the threshold at time T1. The WLV monitoring component 245a may, in response to the word line voltage reaching the threshold, generate (or transmit) the diagnostic signal 315. Although the diagram 301 depicts the diagnostic signal 315 including an upward transition generally similar to the WLV waveform 310, in other embodiments, the diagnostic signal may have generally different appearance than the diagnostic signal 315. For example, the diagnostic signal may include a downward transition at time T1, in some embodiments. In other embodiments, the diagnostic signal may include a short pulse of current at time T1. Moreover, although the example WLV waveform is depicted to include the upward transition (e.g., in response to executing an Activate command), the WLV waveform may include a downward transition, e.g., in response to executing a Precharge command.

The memory device may generate, in conjunction with a reference component of the memory device in some embodiments, the reference signal 320 depicted in the timing diagram 302 such that the memory device can compare the diagnostic signal generated by the WLV monitoring component. The reference signal 320 may include a reference duration, denoted as "DREF" and a reference transition 322, among other features. The reference duration DREF may correspond to a predetermined period of time, during which a word line (e.g., the local word line 225a) is expected to reach a threshold in response to the memory device activating a word line driver (e.g., the word line driver 230a) coupled to the word line at time T0. For example, if a local word line, at its worst case location (e.g., the locations 205 described with reference to FIG. 2), reaches the threshold at or earlier than the reference duration DREF, the local word line is deemed to be able to meet a time requirement associated with a command that has activated the word line driver—e.g., an Activate command, a Precharge command. Moreover, the reference transition 322 may correspond to a transition in a voltage waveform—e.g., the upward transition in voltage as depicted in the reference signal 320. Alternatively, the transition in the reference waveform 310 may be a downward transition (not shown), in some embodiments.

The diagnostic signals 325, 330, and 335 may be generated (transmitted) by the WLV monitoring components (e.g., the WLV monitoring components 245) coupled to corresponding word lines at their worst case locations (e.g., the worst case location 250). Further, the diagnostic signals 325, 330, and 335 each include transitions 327, 332, and 337, respectively. The transitions 327, 332, and 337 may correspond to voltages of the respective word lines reaching the threshold as described with reference to the timing diagram 301.

For example, the diagnostic signal 325 includes the transition 327 at time Ta, which corresponds to a voltage of a word line (e.g., word line 225a) reaching the threshold (e.g., at its worst case location 250) in response to the word line driver coupled to the word line (e.g., word line driver 230a) activated at time T0. In this example, the memory device may determine that the word line is "healthy" (e.g., able to meet a time requirement associated with a command directed to the word line) by comparing the reference signal 320 and the diagnostic signal 325. Namely, the memory device may determine the duration associated with the diagnostic signal 325 (e.g., the duration between T0 and Ta) is less than the reference duration DREF by an amount of time $\Delta 1$. Additionally, or alternatively, the memory device may determine the transition 327 at time Ta in the diagnostic signal 325 precedes the reference transition 322 at time TR by an amount of time $\Delta 1$.

Similarly, the diagnostic signal 330 includes the transition 332 at time Tb, which corresponds to a voltage of a word line (e.g., word line 225b) reaching the threshold (e.g., at its worst case location 250) in response to the word line driver coupled to the word line (e.g., word line driver 230b) activated at time T0. In this example, the memory device may determine that the word line is "unhealthy" (e.g., may not be able to meet a time requirement associated with a command directed to the word line) or otherwise shows a sign of degradation (e.g., able to meet the time requirement now, but may be beneficial to implement preventive and/or precautionary measures against row failure issues that may arise in the future) by comparing the reference signal 320 and the diagnostic signal 330. In this regard, the memory device may determine the duration associated with the diagnostic signal 330 (e.g., the duration between T0 and Tb) is greater than the reference duration DREF by an amount of time $\Delta 2$. Additionally, or alternatively, the memory device may determine the transition 332 at time Tb in the diagnostic signal 330 lags behind the reference transition 322 at time TR by an amount of time $\Delta 2$.

In some embodiments, the memory device may generate (and/or transmit) an alert signal based on comparing the diagnostic signal with the reference signal—e.g., if the diagnostic signal includes a duration greater than the reference duration and/or a transition lagging behind the reference transition. Further, the memory device may store, in response to generating the alert signal, an address associated with the word line in a register (e.g., the registers 118 described with reference to FIG. 1) of the memory device. In some embodiments, the memory device may replace the address with a different address of the memory array (e.g., the memory array 150, the memory array 205) in response to receiving an access command including the address from a host device coupled with the memory device. In some embodiments, the memory device may determine whether an ECC engine (or component) of the memory device detects at least one error in data associated with the address, in response to executing an access command including the address. In some embodiments, the memory device may send the alert signal to a host device coupled with the memory device (or otherwise notifying the host device), the alert signal including the address associated with the word line.

In some embodiments, the memory device may be configured to organize the preventive and/or precautionary measures into multi-tiered measures (or responses) based on the degree of degradation the memory device has detected. For example, if the memory device determines that the degradation corresponds to the amount of time $\Delta 2$ (e.g., the time Tb being earlier than a predetermined time $T_{CRIT}$), the memory device may start to monitor whether the ECC engine (or component) of the memory device detects at least one error in data associated with the address after executing an access command including the address. Further, the memory device determines the degradation corresponds to an amount of time $\Delta 3$ (e.g., the time Tc being later than the time $T_{CRIT}$), the memory device may replace the address with a different address of the memory array in response to receiving an access command including the address, send the alert signal to a host device coupled with the memory device, or otherwise notify the host device of the potential issues associated with the word line.

In some embodiments, the memory device may be configured to determine which word line of the memory array is the one with the most degradation. For example, the memory device may perform a Refresh operation or an error checking and scrubbing (ECS) operation. Such operations typically include accessing (e.g., activating and deactivating word line drivers) word lines of the memory array, and provide opportunities for the memory device to assess "health" of the word lines of the memory array. As a way of example, the diagnostic signal 335 includes the transition 337 at time Tc, which corresponds to a voltage of a word line (e.g., word line 225m) reaching the threshold (e.g., at its worst case location 250) in response to the word line driver coupled to the word line (e.g., word line driver 230m) activated at time T0. The memory device may determine that the duration associated with the diagnostic signal 335 (e.g., the duration between T0 and Tc) is greater than the reference duration DREF, and the duration is greater than any of duration associated with other word lines (e.g., word line 225a, word line 225b) of the memory array. Additionally, or alternatively, the memory device may determine that the transition 337 at time Tc in the diagnostic signal 335 lags behind the reference transition 322 at time TR, and may determine that the transition 337 occurs later than any of transitions associated with other local word lines (word line 225a, word line 225b) of the memory array.

Figure 4:
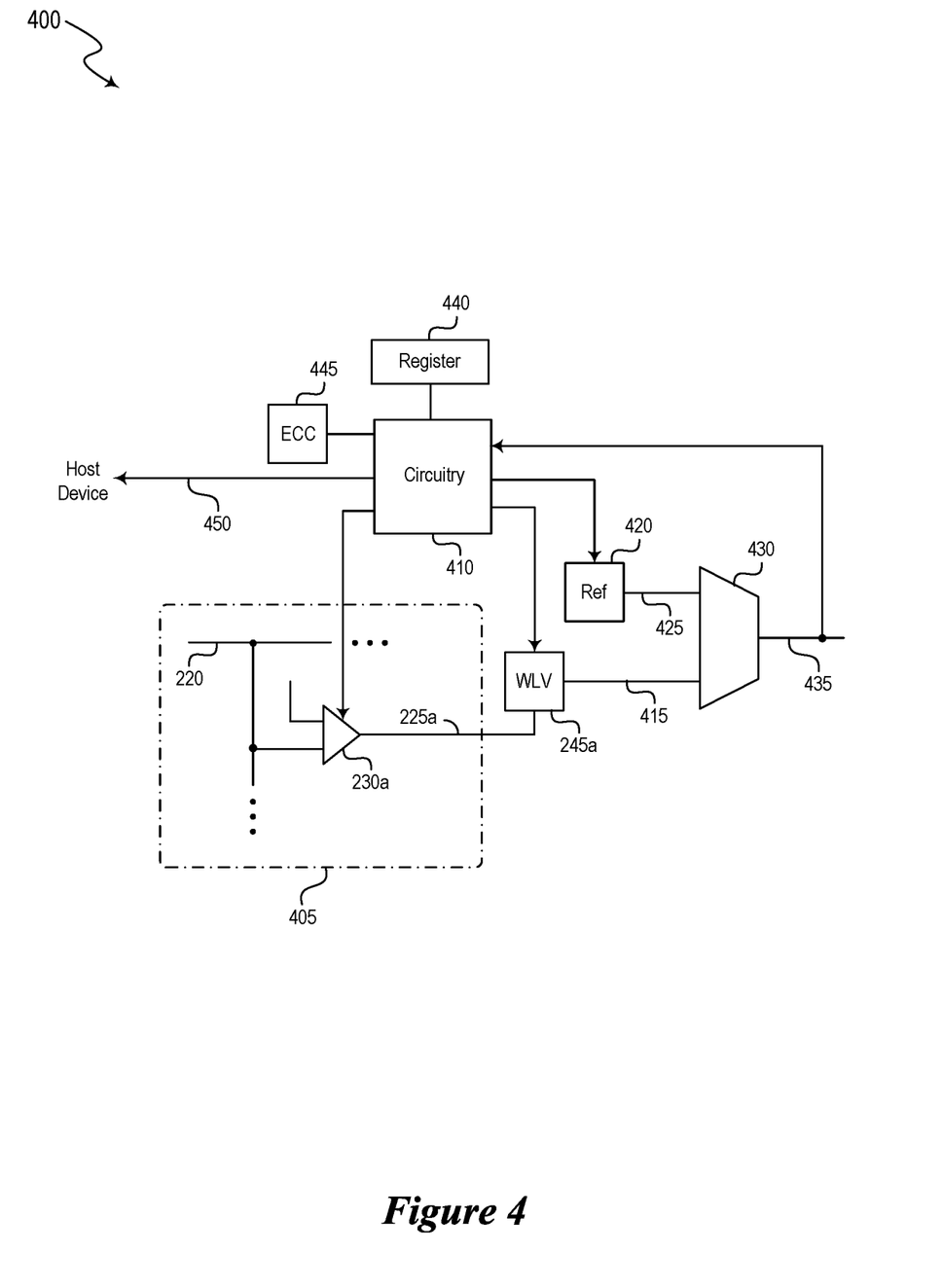
FIG. 4 is a block diagram schematically illustrating word line characteristics monitors for a memory device in accordance with embodiments of the present technology.

FIG. 4 is a block diagram 400 schematically illustrating word line characteristics monitors for a memory device (e.g., the memory devices described with reference to FIGS. 1 through 3) in accordance with embodiments of the present technology. The diagram 400 includes a memory array 405 (which may be an example of or include aspects of the memory array 150 and/or the memory array 205). For example, the memory array 405 illustrates a global word line 220, local word lines 225 (one of which is depicted as a local word line 225a), and word line drivers 230 (one of which is depicted as a word line driver 230a coupled to the local word line 225a). The diagram 400 further includes peripheral circuitry 410 (which may be regarded to include the WLV monitoring component 245a coupled with the local word line 225a at the worst case location), a reference component 420 (which may be referred to as a reference signal/waveform component configured to generate a voltage reference and/or a current reference), a comparator 430, a register 440 (which may be an example of or include aspects of the register 118), an ECC component 445, among others.

As shown in the diagram 400, the peripheral circuitry 410 can be coupled with the memory array 405 and the word line drivers 230. Further, the peripheral circuitry 410 may be configured to activate the word line driver (e.g., the word line driver 230a), and generate (and/or transmit) a diagnostic signal 415 (e.g., a first signal) using the WLV monitoring component 245a in response to the word line voltage of the local word line 225a reaching a threshold. The peripheral circuitry 410 can generate, in conjunction with the reference component 420 in some cases, a reference signal 425 (e.g., the reference signal 320 described with reference to FIG. 3) such that the peripheral circuitry 410 can compare, in conjunction with the comparator 430 in some cases, the diagnostic signal 415 with the reference signal 425. Subsequently, the peripheral circuitry 410 may generate (and/or transmit), in conjunction with the comparator 430 in some cases, an alert signal 435 (e.g., a second signal) based on comparing the diagnostic signal 415 with the reference signal 425. For example, the peripheral circuitry 410 may generate the alert signal 435 if the diagnostic signal 415 includes a duration greater than the reference duration and/or a transition lagging behind the reference transition.

In some cases, the peripheral circuitry 410 can activate the word line driver in response to receiving an access command (e.g., a read command, a write command) directed to the word line (e.g., the local word line 225a) from a host device coupled with the memory device. In some cases, the peripheral circuitry 410 can activate the word line driver in response to initiating a refresh operation directed to the word line. In some cases, the peripheral circuitry 410 can activate the word line driver in response to initiating an ECS operation directed to the word line.

The refresh operation may be initiated in response to a refresh command issued to the memory device or may be self-triggered by the memory device (e.g., to mitigate row hammering issues). The refresh operation may include an operation activating (opening) a row of the memory array (e.g., Activate command), and another operation deactivating the opened memory row (e.g., Precharge command). Further, the memory device may perform the refresh operation to every rows of the memory array. As such, the refresh operation may provide an opportunity for the memory device to assess word line switching characteristics of the entire memory array. In this manner, the memory device may determine which row of the memory array is most prone to experience row failures (e.g., due to degradations in word line switching characteristics).

Similarly, the ECS operation may provide another opportunity for the memory device to assess word line switching characteristics of the rows of the memory array. The ECS operation may read data from each row (e.g., performing an Activate command) and store the data back to the row (after correcting certain errors, if detected in the data) and deactivates the opened row (e.g., performing a Precharge command). Accordingly, during the refresh operation and/or the ECS operation, the peripheral circuitry 410 can monitor the health of the rows (e.g., the local word lines 225) of the memory array 405, and determine which local word line is the one with the most degradation—e.g., prone to experience row failure issues due to the degradation in the word line switching characteristics.

The reference component 420 can be coupled with the peripheral circuitry 410 as shown in the diagram 400 and configured to generate the reference signal 425. The reference signal 425 can include one or more predetermined parameters, such as a reference duration (e.g., DREF described with reference to FIG. 3), a reference transition (e.g., the reference transition 322) in a voltage waveform, or both. The peripheral circuitry 410 can determine, while comparing the diagnostic signal 415 with the reference signal 425, that a duration associated with the diagnostic signal 415 is greater than the reference duration, where the duration corresponds to a period of time between activating the word line driver (e.g., the word line driver 230a) and the word line voltage reaching the threshold. Additionally, or alternatively, the peripheral circuitry 410 can determine, while comparing the diagnostic signal 415 with the reference signal 425, that a transition in the diagnostic signal 415 lags behind the reference transition, where the transition in the diagnostic signal is associated with the word line voltage reaching the threshold.

In some embodiments, the peripheral circuitry 410 can store an address associated with the word line in the register 440 coupled with the peripheral circuitry 410, in response to generating the alert signal 435—e.g., if the diagnostic signal 415 includes the duration greater than the reference duration of the reference signal 425 and/or if the diagnostic signal 415 includes the transition lagging behind the reference transition of the reference signal 425. Further, the peripheral circuitry 410 may replace the address with a different address of the memory array 405 in response to receiving an access command including the address from a host device coupled with the memory device. Additionally, or alternatively, the peripheral circuitry 410 may determine whether the ECC component 445 of the memory device detects at least one error in data associated with the address, in response to executing an access command including the address. Additionally, or alternatively, the peripheral circuitry 410 may send the alert signal 435 to a host device coupled with the memory device (e.g., via the signal 450 to the host), where the alert signal includes the address associated with the word line.

Figure 5:
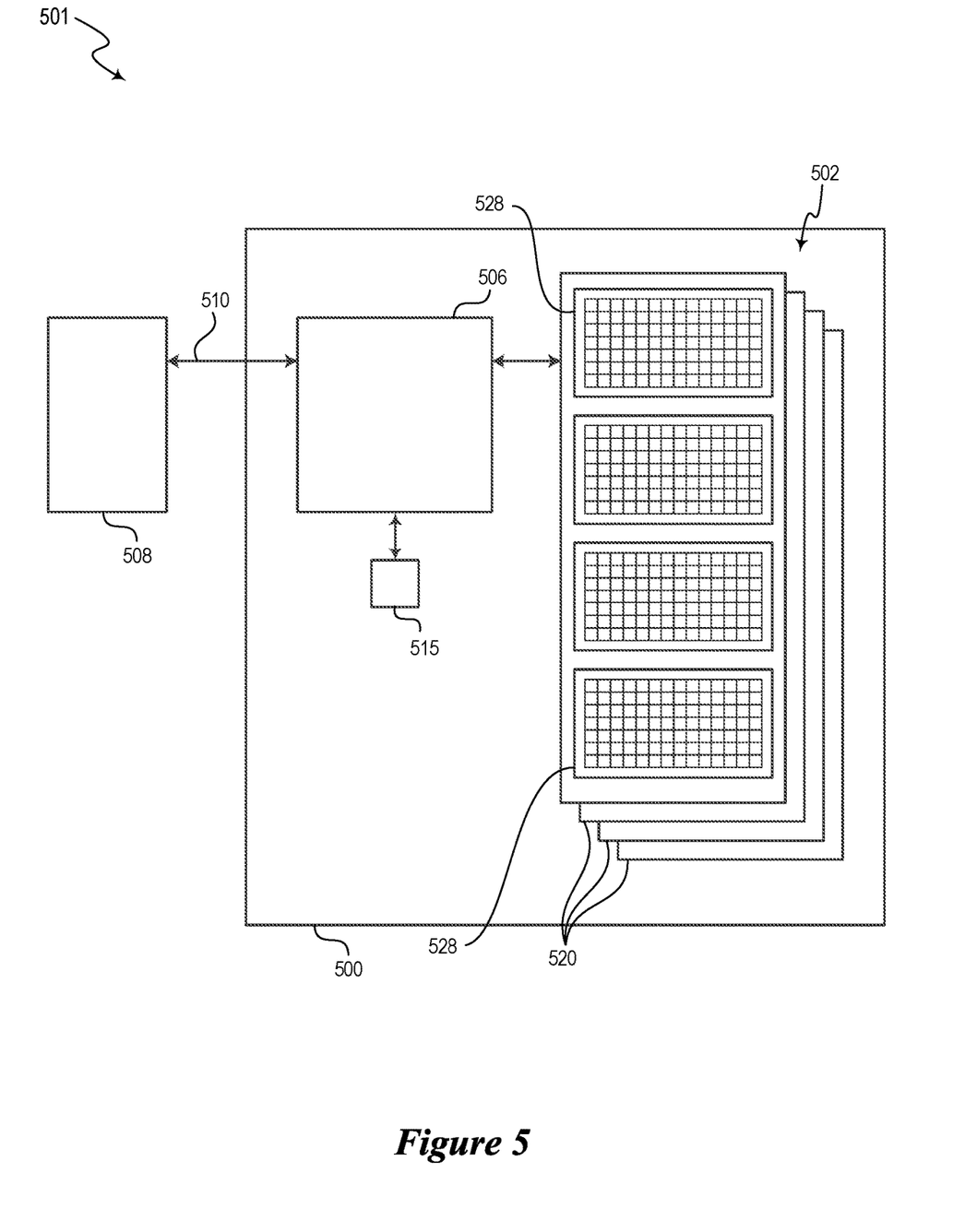
FIG. 5 is a block diagram of a system having a memory device configured in accordance with embodiments of the present technology.

FIG. 5 is a block diagram of a system 501 having a memory device 500 configured in accordance with embodiments of the present technology. The memory device 500 may be an example of or include aspects of the memory device described with reference to FIGS. 1 through 4. As shown, the memory device 500 includes a main memory 502 (e.g., DRAM, NAND flash, NOR flash, FeRAM, PCM, etc.) and control circuitry 506 operably coupled to a host device 508 (e.g., an upstream central processor (CPU), a memory controller). The control circuitry 506 may include aspects of various components described with reference to FIGS. 1 through 4. For example, the control circuitry 506 may include aspects of the command/address input circuit 105, the address decoder 110, the command decoder 115, the word line decoder 210, the WLV monitoring component 245, the peripheral circuitry 410, the reference component 420, the comparator 430, among others.

The main memory 502 includes a plurality of memory units 520, which each include a plurality of memory cells (e.g., the memory cells 240). The memory units 520 can be individual memory dies, memory planes in a single memory die, a stack of memory dies vertically connected with through-silicon vias (TSVs), or the like. For example, in one embodiment, each of the memory units 520 can be formed from a semiconductor die and arranged with other memory unit dies in a single device package. In other embodiments, multiple memory units 520 can be co-located on a single die and/or distributed across multiple device packages. The memory units 520 may, in some embodiments, also be sub-divided into memory regions 528 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 502 and/or the individual memory units 520 can also include other circuit components, such as multiplexers, decoders, buffers, read/write drivers, address registers, data out/data in registers, etc., for accessing and/or programming (e.g., writing) the memory cells and other function, such as for processing information and/or communicating with the control circuitry 506 or the host device 508. Although shown in the illustrated embodiments with a certain number of memory cells, rows, columns, regions, and memory units for purposes of illustration, the number of memory cells, rows, columns, regions, and memory units can vary, and can, in other embodiments, be larger or smaller in scale than shown in the illustrated examples. For example, in some embodiments, the memory device 500 can include only one memory unit 520. Alternatively, the memory device 500 can include two, three, four, eight, ten, or more (e.g., 16, 32, 64, or more) memory units 520. Although the memory units 520 are shown in FIG. 5 as including four memory regions 528 each, in other embodiments, each memory unit 520 can include one, two, three, eight, or more (e.g., 16, 32, 64, 100, 128, 256, or more) memory regions.

In one embodiment, the control circuitry 506 can be provided on the same die as the main memory 502 (e.g., including command/address/clock input circuitry, decoders, voltage and timing generators, input/output circuitry, etc.). In another embodiment, the control circuitry 506 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 506 can include a processor configured to execute instructions stored in memory to perform various processes, logic flows, and routines for controlling operation of the memory device 500, including managing the main memory 502 and handling communications between the memory device 500 and the host device 508. In some embodiments, the control circuitry 506 can include embedded memory with memory registers for storing, e.g., memory addresses, row counters, bank counters, memory pointers, fetched data, etc. In another embodiment of the present technology, a memory device 500 may not include control circuitry, and may instead rely upon external control (e.g., provided by the host device 508, or by a processor or controller separate from the memory device 500).

The host device 508 can be any one of a number of electronic devices capable of utilizing memory for the temporary or persistent storage of information, or a component thereof. For example, the host device 508 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 508 may be a networking device (e.g., a switch, a router, etc.) or a recorder of digital images, audio and/or video, a vehicle, an appliance, a toy, or any one of a number of other products. In one embodiment, the host device 508 may be connected directly to memory device 500, although in other embodiments, the host device 508 may be indirectly connected to memory device (e.g., over a networked connection or through intermediary devices).

In operation, the control circuitry 506 can directly write or otherwise program (e.g., erase) the various memory regions of the main memory 502. The control circuitry 506 communicates with the host device 508 over a host-device bus or interface 510. In some embodiments, the host device 508 and the control circuitry 506 can communicate over a dedicated memory bus (e.g., a DRAM bus). In other embodiments, the host device 508 and the control circuitry 506 can communicate over a serial interface, such as a serial attached SCSI (SAS), a serial AT attachment (SATA) interface, a peripheral component interconnect express (PCIe), or other suitable interface (e.g., a parallel interface). The host device 508 can send various requests (in the form of, e.g., a packet or stream of packets) to the control circuitry 506. A request can include a command to read, write, erase, return information, and/or to perform a particular operation (e.g., a refresh operation, a TRIM operation, a precharge operation, an activate operation, a wear-leveling operation, a garbage collection operation, etc.).

In some embodiments, the memory device 500 includes a memory array (e.g., the main memory 502) having a word line. Also, the memory device 500 may include a word line driver coupled to the word line. Further, the memory device 500 may include a peripheral circuitry (e.g., the control circuitry 506) coupled with the memory array and the word line driver. The peripheral circuitry may be configured to activate the word line driver and to generate, with a word line voltage monitoring component (e.g., the WLV monitoring components 245) of the peripheral circuitry, a diagnostic signal in response to the word line voltage reaching a threshold. Further, the peripheral circuitry may be configured to compare the diagnostic signal with a reference signal. In some cases, the peripheral circuitry may generate an alert signal based on comparing the diagnostic signal with the reference signal, and send the alert signal to the host device 508 (e.g., via the host-device bus or interface 510). The alert signal may include an address associated with the word line and/or other indications to notify the host device 508 of the degradations associated with the word line characteristics (e.g., the word line switching characteristics).

In some embodiments, the host device 508 may be configured to transmit an access command directed to the address, in response to receiving the alert signal including the address. Further, the host device 508 may be configured to monitor whether an ECC engine 515 of the memory device 500 detects at least one error in data associated with the address, in response to executing the access command. In some embodiments, the host device 508, in response to receiving the alert signal including the address, is configured to perform at least one of forbidding the address when generating access commands directed to the memory device 500, retiring a portion of the memory array including the address, or prohibiting access operations directed to the memory device 500.

Figure 6:
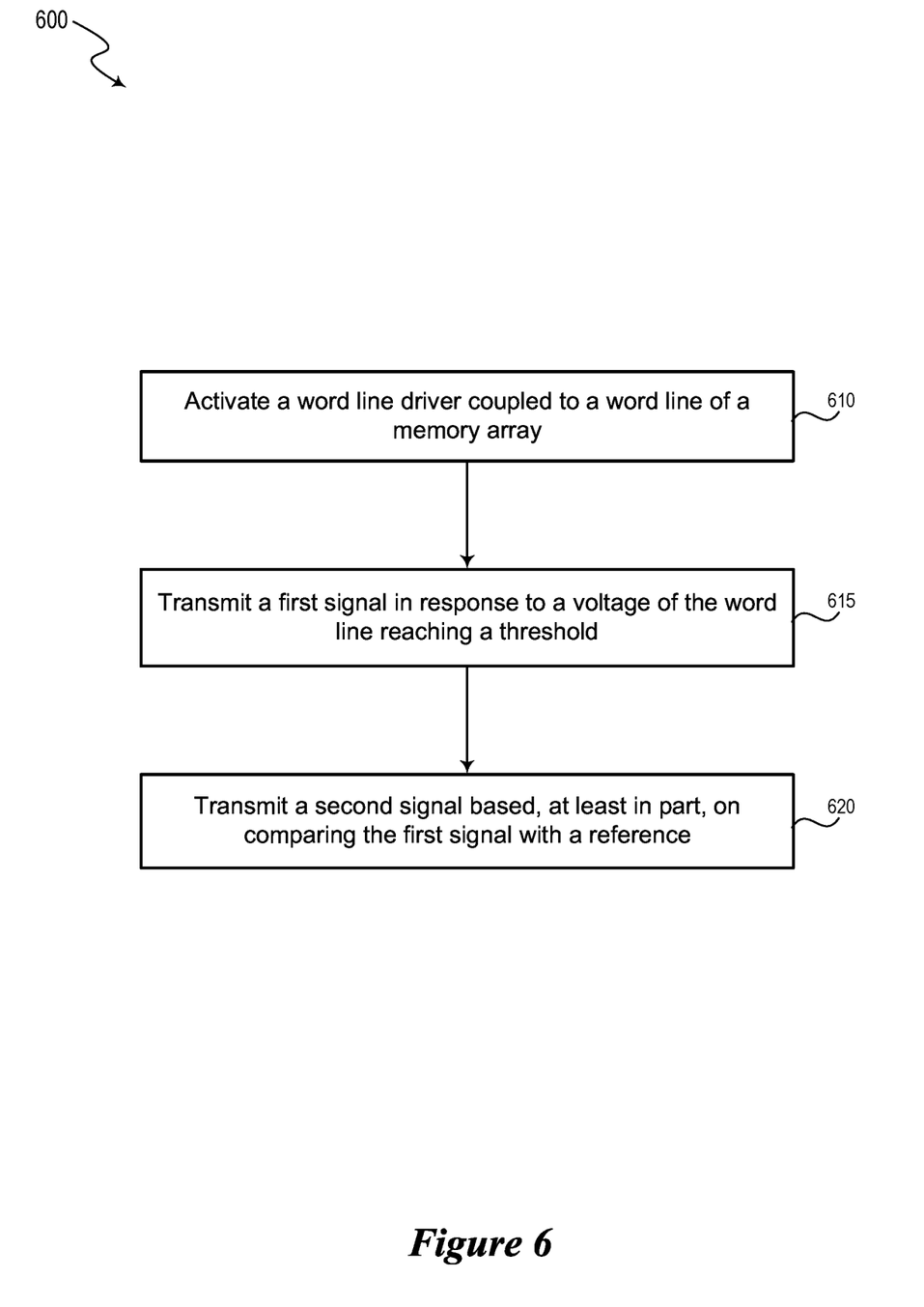
FIG. 6 is a flowchart illustrating a method of operating a memory device in accordance with embodiments of the present technology.

FIG. 6 is a flow chart 600 illustrating a method of operating a memory device in accordance with embodiments of the present technology. The flow chart 600 may be an example of or include aspects of a method that the memory device (e.g., the peripheral circuitry 410, the control circuitry 506) may perform as described with reference to FIGS. 1 through 5.

The method includes activating a word line driver coupled to a word line of a memory array (box 610). In accordance with one aspect of the present technology, the activating feature of box 610 can be performed by the peripheral circuitry 410 (or the control circuitry 506), as described with reference to FIGS. 1 through 5.

The method further includes transmitting a first signal in response to a voltage of the word line reaching a threshold (box 615). In accordance with one aspect of the present technology, the transmitting feature of box 615 can be performed by the peripheral circuitry 410 (or the control circuitry 506), as described with reference to FIGS. 1 through 5.

The method further includes transmitting a second signal based, at least in part, on comparing the first signal with a reference (box 620). In accordance with one aspect of the present technology, the transmitting feature of box 620 can be performed by the peripheral circuitry 410 (or the control circuitry 506), as described with reference to FIGS. 1 through 5.

In some embodiments, activating the word line driver may be in response to receiving an access command directed to the word line from a host device coupled with an apparatus including the memory array, initiating a refresh operation directed to the word line, or initiating an error check and scrub (ECS) operation directed to the word line. In some embodiments, the reference includes a reference transition in a voltage waveform, and comparing the first signal with the reference further includes determining that a transition in the first signal lags behind the reference transition, where the transition in the first signal is associated with the word line voltage reaching the threshold. In some embodiments, the reference includes a reference duration, and comparing the first signal with the reference further includes determining that a duration associated with the first signal is greater than the reference duration, where the duration corresponds to a period of time between activating the word line driver and the word line voltage reaching the threshold.

In some embodiments, the memory array is configured to include a global word line and a plurality of local word lines coupled with the global word line, where the word line is a first local word line of the plurality of local word lines, the word line driver is a first word line driver configured to drive the first local word line from a first end of the first local word line, and a first word line voltage monitoring component is coupled to a second end of the first local word line opposite to the first end. In some embodiments, the method can further include storing, in response to generating the second signal, an address associated with the word line in a register of an apparatus including the memory array, and performing at least one of replacing the address with a different address in response to receiving an access command including the address from a host device coupled with the apparatus, determining whether an ECC engine of the apparatus detects at least one error in data associated with the address, in response to executing an access command including the address, or sending the second signal to the host device, the second signal including the address associated with the word line.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
   a memory array;
   a word line driver coupled to a word line of the memory array; and
   peripheral circuitry coupled with the memory array and the word line driver, the peripheral circuitry configured to:
   activate the word line driver;
   transmit a first signal in response to a voltage of the word line reaching a threshold; and
   transmit a second signal based, at least in part, on comparing the first signal with a reference.

2. The apparatus of claim 1, wherein the peripheral circuitry is configured to activate the word line driver in response to:
   receiving an access command directed to the word line from a host device coupled with the apparatus;
   initiating a refresh operation directed to the word line; or
   initiating an error checking and scrubbing (ECS) operation directed to the word line.

3. The apparatus of claim 1, further comprising:
   a reference component coupled with the peripheral circuitry, the reference component configured to generate the reference including one or more predetermined parameters having a reference duration, a reference transition in a voltage waveform, or both.

4. The apparatus of claim 1, wherein the reference includes a reference duration, and the peripheral circuitry is configured to:
   determine, while comparing the first signal with the reference, that a duration associated with the first signal is greater than the reference duration, wherein the duration corresponds to a period of time between activating the word line driver and the word line voltage reaching the threshold.

5. The apparatus of claim 1, wherein the reference includes a reference transition in a voltage waveform, and the peripheral circuitry is configured to:
   determine, while comparing the first signal with the reference, that a transition in the first signal lags behind the reference transition, wherein the transition in the first signal is associated with the word line voltage reaching the threshold.

6. The apparatus of claim 1, wherein the memory array is configured to include a global word line and a plurality of local word lines coupled with the global word line, and wherein:
   the word line is a first local word line of the plurality of local word lines;
   the word line driver is a first word line driver configured to drive the first local word line from a first end of the first local word line; and
   a first word line voltage monitoring component of the peripheral circuitry is coupled to a second end of the first local word line opposite to the first end, the first word line voltage monitoring component configured to generate the first signal.

7. The apparatus of claim 6, wherein the reference includes a reference duration, and the peripheral circuitry is configured to:
   determine that a duration associated with the first signal is greater than the reference duration, wherein the duration corresponds to a period of time between activating the first word line driver and the first word line voltage reaching the threshold; and
   determine that the duration is greater than any of duration associated with other local word lines of the plurality.

8. The apparatus of claim 6, wherein the reference includes a reference transition in a voltage waveform, and the peripheral circuitry is configured to:
   determine that a transition in the first signal lags behind the reference transition, wherein the transition in the first signal is associated with the first word line voltage reaching the threshold; and
   determine that the transition occurs later than any of transitions associated with other local word lines of the plurality.

9. The apparatus of claim 1, wherein the peripheral circuitry is further configured to:
   store, in response to generating the second signal, an address associated with the word line in a register of the apparatus; and
   replace the address with a different address of the memory array in response to receiving an access command including the address from a host device coupled with the apparatus.

10. The apparatus of claim 1, wherein the peripheral circuitry is further configured to:
    store, in response to generating the second signal, an address associated with the word line in a register of the apparatus; and
    determine whether an error checking and correcting (ECC) engine of the apparatus detects at least one error in data associated with the address, in response to executing an access command including the address.

11. The apparatus of claim 1, wherein the peripheral circuitry is further configured to:
store, in response to generating the second signal, an address associated with the word line in a register of the apparatus; and
send the second signal to a host device coupled with the apparatus, the second signal including the address associated with the word line.

12. A method, comprising:
activating a word line driver coupled to a word line of a memory array;
transmitting a first signal in response to a voltage of the word line reaching a threshold; and
transmitting a second signal based, at least in part, on comparing the first signal with a reference.

13. The method of claim 12, wherein activating the word line driver is in response to:
receiving an access command directed to the word line from a host device coupled with an apparatus including the memory array;
initiating a refresh operation directed to the word line; or
initiating an error check and scrub (ECS) operation directed to the word line.

14. The method of claim 12, wherein the reference includes a reference transition in a voltage waveform, and comparing the first signal with the reference further comprises:
determining that a transition in the first signal lags behind the reference transition, wherein the transition in the first signal is associated with the word line voltage reaching the threshold.

15. The method of claim 12, wherein the reference includes a reference duration, and comparing the first signal with the reference further comprises:
determining that a duration associated with the first signal is greater than the reference duration, wherein the duration corresponds to a period of time between activating the word line driver and the word line voltage reaching the threshold.

16. The method of claim 12, wherein the memory array is configured to include a global word line and a plurality of local word lines coupled with the global word line, and wherein:
the word line is a first local word line of the plurality of local word lines;
the word line driver is a first word line driver configured to drive the first local word line from a first end of the first local word line; and
a first word line voltage monitoring component is coupled to a second end of the first local word line opposite to the first end.

17. The method of claim 12, furthering comprising:
storing, in response to generating the second signal, an address associated with the word line in a register of an apparatus including the memory array; and
performing at least one of:
replacing the address with a different address in response to receiving an access command including the address from a host device coupled with the apparatus;
determining whether an error checking and correcting (ECC) engine of the apparatus detects at least one error in data associated with the address, in response to executing an access command including the address; or
sending the second signal to the host device, the second signal including the address associated with the word line.

18. A system, comprising:
a host device; and
a semiconductor device coupled with the host device, the semiconductor device including:
a memory array;
a word line driver coupled to a word line of the memory array; and
peripheral circuitry coupled with the memory array and the word line driver, the peripheral circuitry configured to:
activate the word line driver;
transmit a first signal in response to a voltage of the word line reaching a threshold;
transmit a second signal based, at least in part, on comparing the first signal with a reference; and
send the second signal to the host device, the second signal including an address associated with the word line.

19. The system of claim 18, wherein the host device is configured to:
transmit an access command directed to the address, in response to receiving the second signal including the address; and
monitor whether an error checking and correcting (ECC) engine of the semiconductor device detects at least one error in data associated with the address, in response to executing the access command.

20. The system of claim 18, wherein the host device, in response to receiving the second signal including the address, is configured to perform at least one of:
forbidding the address when generating access commands directed to the semiconductor device;
retiring a portion of the memory array including the address; or
prohibiting access operations directed to the semiconductor device.

* * * * *